US012718093B2

(12) United States Patent
Shiu et al.

(10) Patent No.: US 12,718,093 B2
(45) Date of Patent: Aug. 25, 2026

(54) MACRO PLACEMENT IN CONTINUOUS ACTION SPACE USING AN ARTIFICIAL INTELLIGENCE APPROACH

(71) Applicant: MediaTek Inc., Hsinchu City (TW)

(72) Inventors: Da-Shan Shiu, Hsinchu City (TW); Alexandru Cioba, Cambridge (GB); Fu-Chieh Chang, Hsinchu City (TW)

(73) Assignee: MediaTek Inc., Hsinchu City (TW)

( * ) Notice: Subject to any disclaimer, the term of this patent is extended or adjusted under 35 U.S.C. 154(b) by 167 days.

(21) Appl. No.: 18/042,431

(22) PCT Filed: Oct. 12, 2022

(86) PCT No.: PCT/CN2022/124860
§ 371 (c)(1),
(2) Date: Feb. 21, 2023

(87) PCT Pub. No.: WO2023/061407
PCT Pub. Date: Apr. 20, 2023

(65) Prior Publication Data

US 2024/0289527 A1 Aug. 29, 2024

Related U.S. Application Data

(60) Provisional application No. 63/254,582, filed on Oct. 12, 2021.

(51) Int. Cl.

| | |
|---|---|
| ***G06F 30/392*** | (2020.01) |
| ***G06F 30/398*** | (2020.01) |
| ***G06N 3/08*** | (2023.01) |

(52) U.S. Cl.
CPC ............. *G06N 3/08* (2013.01); *G06F 30/392* (2020.01); *G06F 30/398* (2020.01)

(58) Field of Classification Search
USPC ........................................................ 716/100
See application file for complete search history.

(56) References Cited

U.S. PATENT DOCUMENTS 10,699,043 B2 6/2020 Ho
11,424,539 B2 8/2022 Alpman
(Continued)

FOREIGN PATENT DOCUMENTS

CN 111406291 A 7/2020

OTHER PUBLICATIONS

PCT written opinion and international search report, PCT/CN2022/124860 mailed Dec. 27, 2022.
(Continued)

*Primary Examiner* — Bryce M Aisaka
(74) *Attorney, Agent, or Firm* — Tong J. Lee

(57) ABSTRACT

A neural network (NN) performs macro placement on a chip. A mask is updated to mark invalid regions occupied by already-placed macros on a chip canvas. A policy network of the NN generates summary statistics of a two-dimensional (2D) continuous probability distribution over a continuous action space for a given state of the chip canvas. The NN selects an action based on the continuous probability distribution. The selected action corresponds to a coordinate in an unmasked region. The NN generates a trajectory including (state, action) pairs. The final state in the trajectory corresponds to a completed placement of macros.

20 Claims, 13 Drawing Sheets

(56) References Cited

U.S. PATENT DOCUMENTS

| | | | | |
|---|---|---|---|---|
| 2007/0220470 | A1 | 9/2007 | Meyyappan | |
| 2015/0002527 | A1* | 1/2015 | Chedeau | G06T 11/60<br>345/581 |
| 2019/0378047 | A1 | 12/2019 | Pistoia | |
| 2021/0224463 | A1* | 7/2021 | Zhang | G06F 30/392 |

OTHER PUBLICATIONS

Dynamic Weights in Multi-Objective Deep Reinforcement Learning, Abels et al., Proc. of the 36th International Conference on Machine Learning, California, pp. 11-20, Dec. 31, 2019.

Regularising neural networks for future trajectory prediction via inverse reinforcement learning framework, Choi et al., IET Computer Vision, vol. 14, issue 5, pp. 192-200, Aug. 11, 2020.

Chip Placement with Deep Reinforcement Learning, Mirhoseini et al., https://arxiv.org/abs/2004.10746, pp. 1-15, Apr. 22, 2020.

* cited by examiner

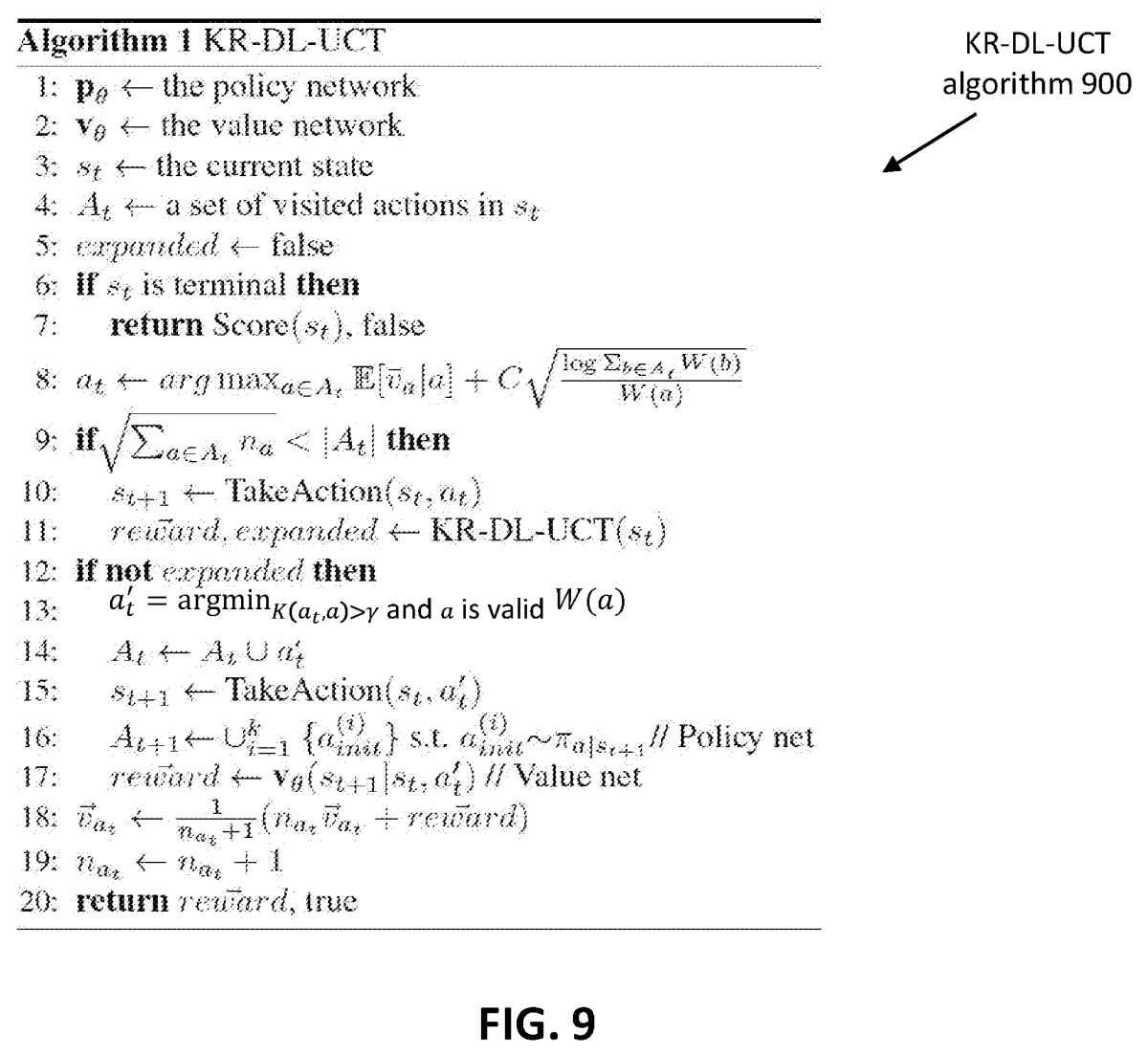

KR-DL-UCT algorithm 900

Algorithm 1 KR-DL-UCT

1: $\mathbf{p}_\theta \leftarrow$ the policy network
2: $\mathbf{v}_\theta \leftarrow$ the value network
3: $s_t \leftarrow$ the current state
4: $A_t \leftarrow$ a set of visited actions in $s_t$
5: $expanded \leftarrow$ false
6: if $s_t$ is terminal then
7:     return Score$(s_t)$, false
8: $a_t \leftarrow arg\max_{a \in A_t} \mathbb{E}[\vec{v}_a|a] + C\sqrt{\frac{\log \Sigma_{b \in A_t} W(b)}{W(a)}}$
9: if $\sqrt{\sum_{a \in A_t} n_a} < |A_t|$ then
10:     $s_{t+1} \leftarrow$ TakeAction$(s_t, a_t)$
11:     $re\vec{w}ard, expanded \leftarrow$ KR-DL-UCT$(s_t)$
12: if not $expanded$ then
13:     $a'_t = \text{argmin}_{K(a_t,a)>\gamma}$ and $a$ is valid $W(a)$
14:     $A_t \leftarrow A_t \cup a'_t$
15:     $s_{t+1} \leftarrow$ TakeAction$(s_t, a'_t)$
16:     $A_{t+1} \leftarrow \cup_{i=1}^{k} \{a_{init}^{(i)}\}$ s.t. $a_{init}^{(i)} \sim \pi_{a|s_{t+1}}$ // Policy net
17:     $re\vec{w}ard \leftarrow \mathbf{v}_\theta(s_{t+1}|s_t, a'_t)$ // Value net
18: $\vec{v}_{a_t} \leftarrow \frac{1}{n_{a_t}+1}(n_{a_t}\vec{v}_{a_t} + re\vec{w}ard)$
19: $n_{a_t} \leftarrow n_{a_t} + 1$
20: return $re\vec{w}ard$, true

FIG. 9

MACRO PLACEMENT IN CONTINUOUS ACTION SPACE USING AN ARTIFICIAL INTELLIGENCE APPROACH

CROSS-REFERENCE TO RELATED APPLICATIONS

This application claims the benefit of U.S. Provisional Application No. 63/254,582 filed on Oct. 12, 2021, the entirety of which is incorporated by reference herein.

TECHNICAL FIELD

Embodiments of the invention relate to methods and apparatuses based on machine learning and artificial intelligence (AI) for generating a macro placement on a semiconductor chip.

BACKGROUND

In an integrated circuits (IC) design, a macro is a set of circuit components that can be viewed as a black box. The logic and electronic behavior of the macro are given but the internal structural description may or may not be known. Mixed-size macro placement is the problem of placing macros of various sizes on a chip canvas to optimize an objective such as the wirelength.

Conventionally, a placement area (i.e., chip canvas) is partitioned into equal-sized unit areas referred to as a grid. Such a chip canvas is called a grid-discretized chip canvas. During the placement, the centers of the macros are aligned with the centers of one of the grid points. Empirically, the quality of placement depends on the configuration of the grid. In practice, the placement quality does not necessarily improve when the grid resolution increases.

A placement area with a low grid resolution (i.e., few grid points with large grid spacing) has the problem that macros may be placed with unacceptable overlaps. Also, the placement of very small macros becomes inaccurate as displacement errors can go up to half of the grid spacing size.

In a placement area with a high grid resolution (i.e., many grid points with small grid spacing), the runtime of an artificial intelligence (AI) placement agent can increase exponentially in the sample collection phase in order to reach consistent standards of performance. Hence, in practice, experimenters may observe poorer results for higher grid resolution with the same hyperparameter configuration.

Thus, there is a need for improving macro placement techniques such that an AI agent can perform macro placement within an acceptable time with high performance.

SUMMARY

In one embodiment, a method is provided for a neural network (NN) to perform macro placement on a chip. The method includes: updating a mask to mark invalid regions occupied by already-placed macros on a chip canvas; generating, by a policy network of the NN, summary statistics of a two-dimensional (2D) continuous probability distribution over a continuous action space for a given state of the chip canvas; and selecting an action based on the continuous probability distribution. The selected action corresponds to a coordinate in an unmasked region. The method further comprises generating a trajectory including (state, action) pairs, wherein a final state in the trajectory corresponds to a completed placement of macros.

In another embodiment, a system is operative to train an NN for macro placement. The system includes processing hardware and memory coupled to the processing hardware to store information on the NN and macros to be placed on a chip. The processing hardware is operative to update a mask to mark invalid regions occupied by already-placed macros on a chip canvas; generate, by a policy network of the NN, summary statistics of a two-dimensional (2D) continuous probability distribution over a continuous action space for a given state of the chip canvas; and select an action based on the continuous probability distribution. The selected action corresponds to a coordinate in an unmasked region. The processing hardware is further operative to generate a trajectory including (state, action) pairs, wherein a final state in the trajectory corresponds to a completed placement of macros.

Other aspects and features will become apparent to those ordinarily skilled in the art upon review of the following description of specific embodiments in conjunction with the accompanying figures.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

FIG. 9 illustrates a KR-DL-UCT algorithm for macro placement according to one embodiment.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

In this disclosure, a neural network (NN) is trained to learn a policy for placing an object (e.g., a macro) at a location (x, y) on a circuit block (e.g., a semiconductor chip, also referred to as a chip), where (x, y) is a real-valued coordinate on a chip canvas that is not grid-discretized. A macro contains a set of integrated circuit components, and a chip canvas is a two-dimensional (2D) area on the chip where macros may be placed. The coordinate (x, y) defines an action in a continuous action space. A conventional action space is grid-discretized. That is, each macro is placed at a location (x', y') where the permissible domain of (x', y') is a grid. The continuous action space removes the aforementioned problems associated with grid discretization. In one embodiment, the NN includes a policy network that generates summary statistics of a 2D continuous probability distribution over the action space. In one embodiment, the summary statistics include a mean and a standard deviation for each dimension. Alternative or additional statistics such as variance, average, confidence intervals, etc. may also be included.

For a macro placement problem, the action space A is a real coordinate space representing a chip canvas with width W and height H, such that:

$$\mathcal{A} = \{(x, y) : 0 \le x \le W, 0 \le y \le H, x \in \mathbb{R}, y \in \mathbb{R}\}$$

In one embodiment with a deterministic policy, the policy network chooses an action that has the highest probability based on the continuous probability distribution. Given a canvas with width w and height h, the action is the coordinate of the current macro to be placed. This coordinate of the action is a tuple (x, y) such that $x \in [0, w]$, $y \in [0, h]$, which is directly generated by the policy network.

In one embodiment with a stochastic policy, the policy network samples an action based on the continuous probability distribution. As an example, the coordinate of an action may be a tuple (x, y) sampled from two continuous Gaussian distributions $N_x$ and $N_y$.

Figure 1A:
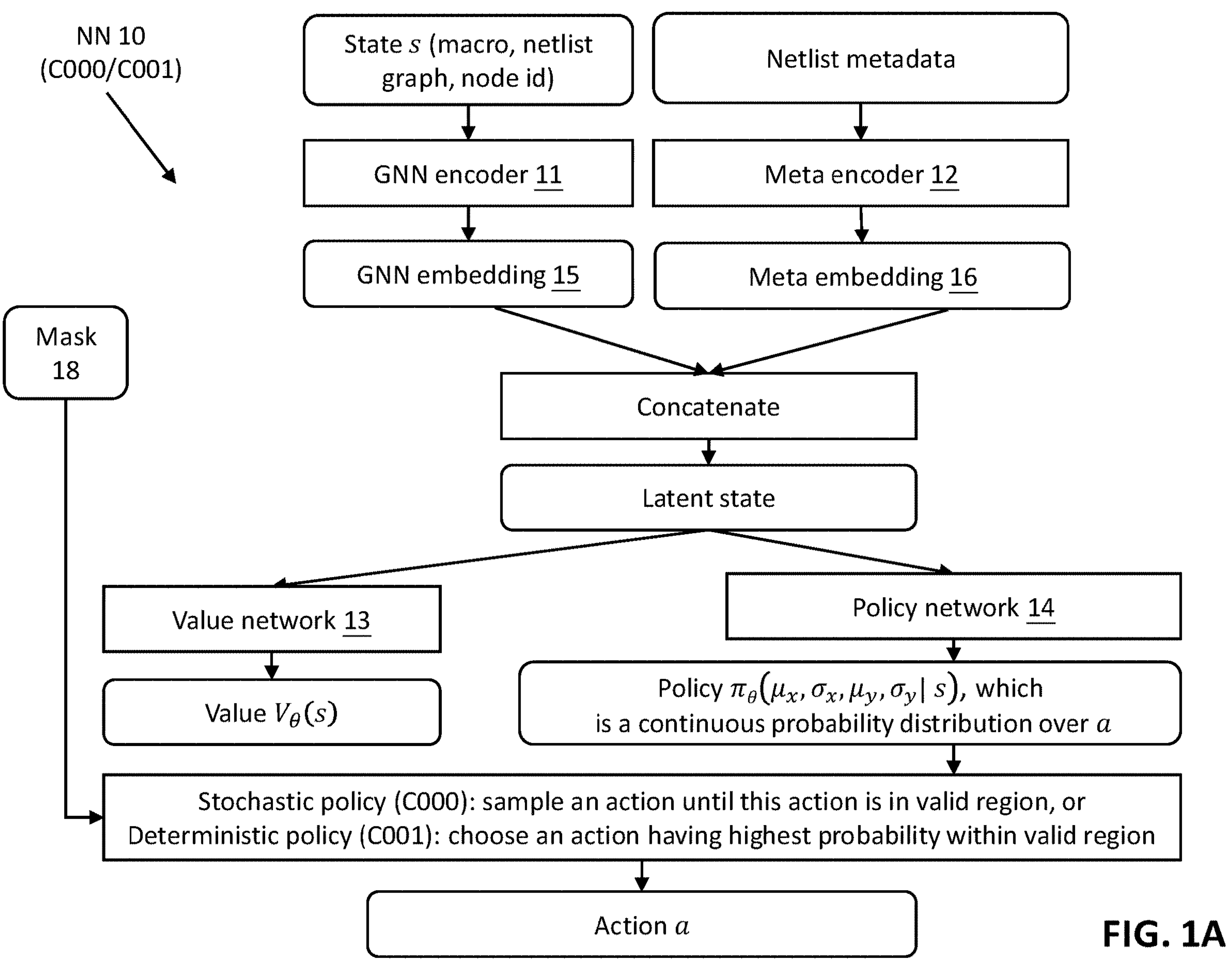
FIG. 1A is a block diagram illustrating a neural network (NN) for macro placement in a continuous action space according to one embodiment.

FIG. 1A is a block diagram illustrating an NN 10 for macro placement in a continuous action space according to one embodiment. NN 10 receives inputs including state s (macro, netlist graph, node id) and netlist metadata. NN 10 encodes the state using a graph neural network (GNN) 11 into a low-dimension vector, referred to as a GNN embedding 15. NN 10 also encodes the netlist metadata using a meta encoder 12 into another low-dimension vector, referred to as a meta embedding 16. The GNN embedding 15 and the meta embedding 16 are concatenated into a latent state. This latent state is fed into a value network 13 and a policy network 14. Value network 13 generates a value that predicts the reward of action a. Policy network 14 generates a policy $\pi_\theta(\mu_x, \sigma_x, \mu_y, \sigma_y|s)$, which is specified by the summary statistics of a two-dimensional (2D) probability distribution of action a for a given state s. In one embodiment, the summary statistics include the mean and the standard deviation in each dimension of the probability distribution (e.g., four real numbers: $\mu_x$, $\sigma_x$, $\mu_y$, $\sigma_y$).

A state refers to the state of a chip canvas including any macros placed thereon. An action is a real-value coordinate on the chip canvas for placing a macro. The probability distribution is a continuous function over the action space. Thus, the action space is also continuous and is referred to as a continuous action space. In a continuous action space, there are uncountable numbers of real-value coordinates on which a macro can be placed. That is, an action can be anywhere in this continuous action space, subject to the validity constraint (e.g., only in the unmasked region) and hardware precision (e.g., the bit-width of floating-point number representation used in the NN computations). The output of policy network 14 is the summary statistics of the continuous probability distribution of action a. An action can be selected (e.g., by sampling or choice) based on the summary statistics subject to the validity constraint. By contrast, a conventional chip canvas is first partitioned into a grid, and the probability distribution of action a is calculated over the grid points to generate probability values for each grid point. Then an action is sampled or chosen based on these probability values subject to the validity constraint. The large number of probability values over the grid points incurs a significant amount of computation and storage overhead during NN runtime.

NN 10 is parameterized by θ, which represents the set of parameters that defines NN 10. NN 10 applies a mask 18 on the chip canvas and outputs an action based on policy $\pi_\theta$. The action is generated based on policy $\pi_\theta$ as well as a stochastic policy or a deterministic policy. With the deterministic policy, NN 20 chooses an action that has the highest probability within the valid region of the chip canvas (i.e., unmasked region). With the stochastic policy, NN 10 samples one or more actions based on the probability distribution until a sampled action is in the valid region of the chip canvas. In this disclosure, NN 10 following the stochastic policy is referred to as C000, and NN 10 following the deterministic policy is referred to as C001.

Figure 1B:
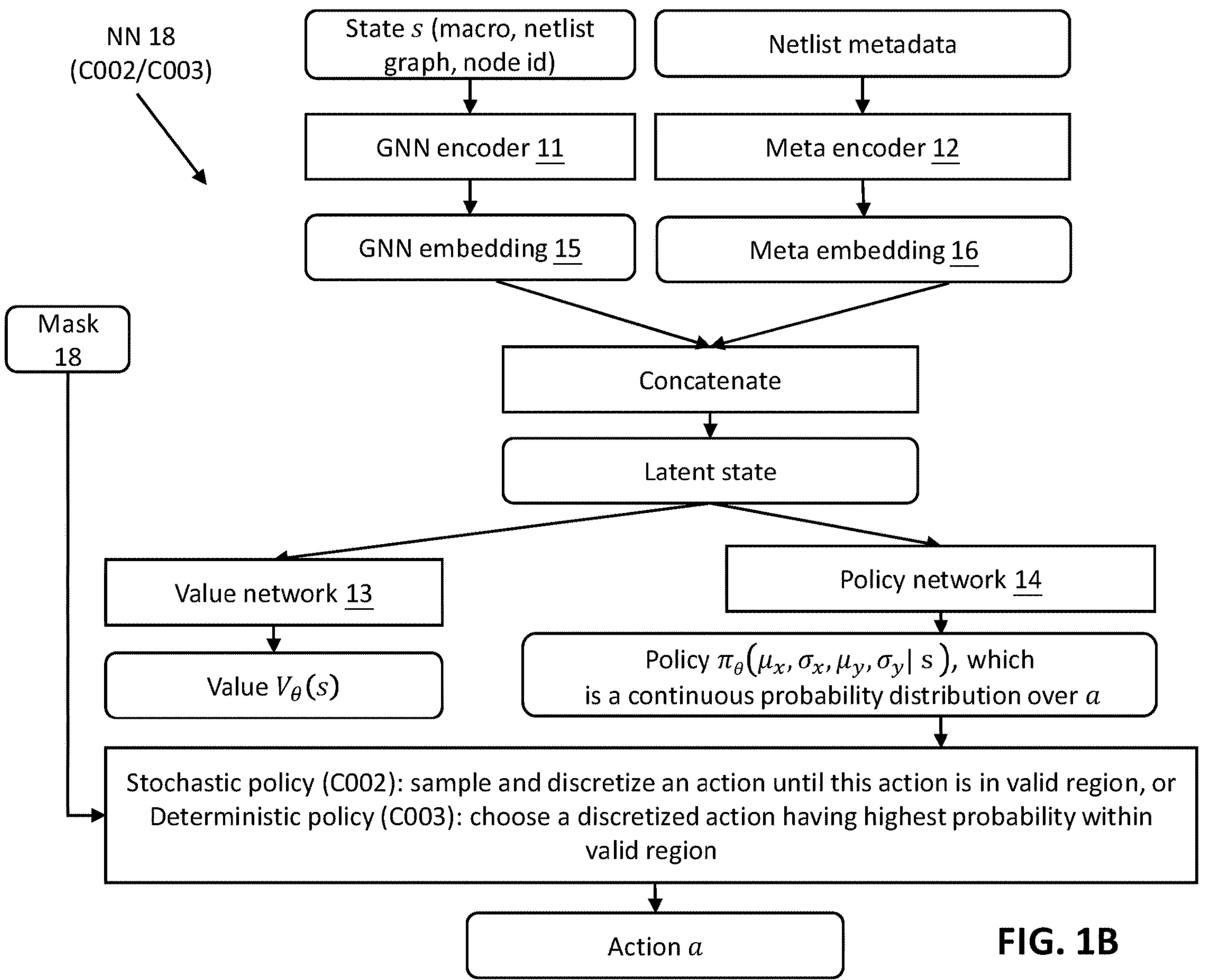
FIG. 1B is a block diagram illustrating an NN for macro placement in a discretized action space according to one embodiment.

FIG. 1B is a block diagram illustrating an NN 18 for macro placement in a discretized action space according to another embodiment. NN 18 differs from NN 10 in that the output of NN 18, which is an action a, is discretized into a pair of fixed-length numbers (i.e., a 2D coordinate). Policy network 14 of NN 18 outputs the summary statistics of a continuous probability distribution of an action. The coordinate (i.e., action) sampled or chosen based on the continuous probability distribution is then discretized by being rounded up/down into a given number of decimal points (i.e., fixed-length numbers). The action is generated based on policy $\pi_\theta$ as well as a stochastic policy or a deterministic policy. With the stochastic policy, NN 18 samples an action and discretizes the action. The action is accepted if it is in the valid region of the chip canvas (i.e., unmasked region). If not, the sampling and discretizing are repeated until a sampled action is in the valid region of the chip canvas. With the deterministic policy, NN 18 chooses a discretized action which that has the highest probability within a valid region of the chip canvas. In this disclosure, NN 18 following the stochastic policy is referred to as C002, and NN 18 following the deterministic policy is referred to as C003.

Figure 2:
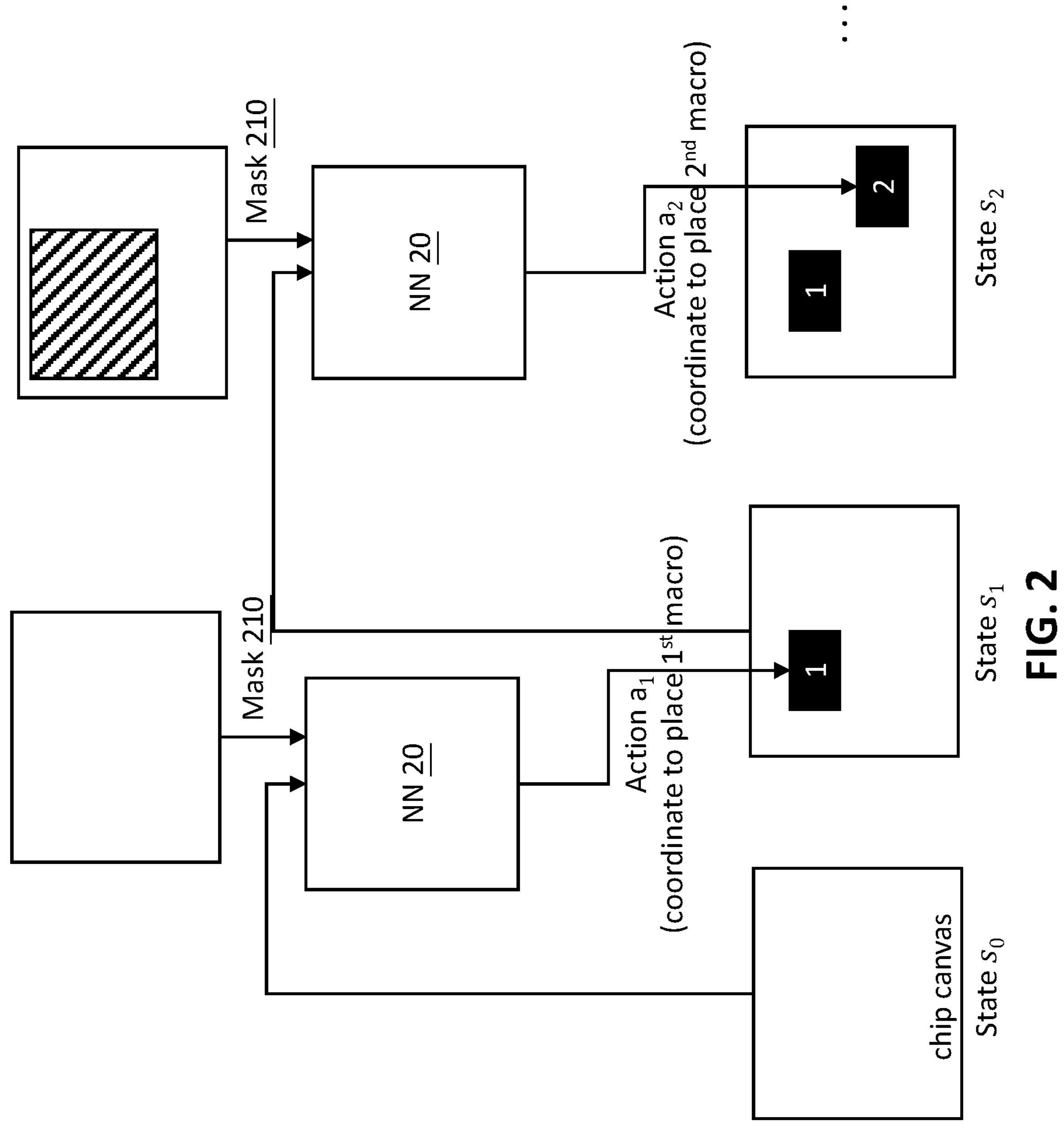
FIG. 2 illustrates a macro placement process according to one embodiment.

FIG. 2 illustrates a macro placement process according to one embodiment. Given a chip canvas and a trained NN 20, NN 20 performs an action $a_1$ to place a macro 1 on a first coordinate of the canvas. NN 20 may have the same network structure as NN 10 (FIG. 1A) or NN 18 (FIG. 1B). The state of the canvas at this point (after action $a_1$ is performed) is denoted as $s_1$. A mask 210 is updated to indicate the area surrounding macro 1 that is not to be occupied by the next macro. NN 20 then performs an action $a_2$ to place a macro 2 on a second coordinate of the unmasked portion of the canvas. The canvas state is updated to $s_2$, and mask 210 is also updated (not shown) to prevent subsequent macros from undesired overlapping with the first two macros. The chip placement process (including the mask updating process) continues until all of the macros are placed on the chip canvas. The chip placement process illustrated in FIG. 2 produces a trajectory of (state, action) pairs ($s_1$, $a_1$), . . . , ($s_n$, $a_n$) for placing n macros, where the final state $s_n$ denotes the chip canvas with completed macros placement.

In the following, the description with reference to FIG. 3-FIG. 6 provides a first training method for training an NN to operate in a continuous action space. The description with reference to FIG. 7-FIG. 10 provides a second training method for training an NN to operate in a continuous action space. These methods may be performed by a computing system, such as a system 1100 in FIG. 11, on which a placement tool such as an NN is trained. Moreover, some of the methods in the following descriptions refer to the use of a "threshold." It is understood that the thresholds in different methods/stages/operations/steps may refer to different numerical values.

Figure 3:
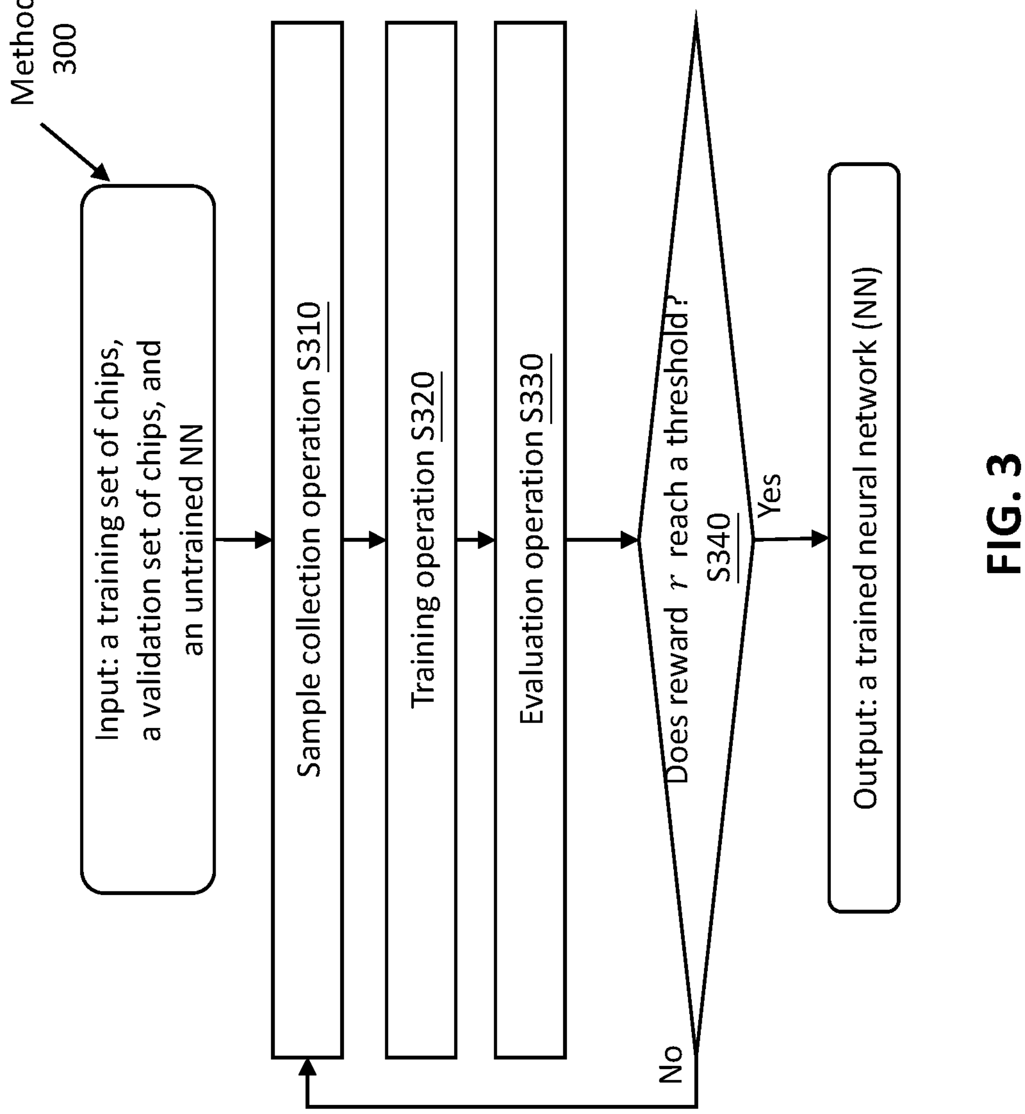
FIG. 3 is a flow diagram illustrating a method for training an NN to perform macro placement in a continuous action space according to one embodiment.

FIG. 3 is a flow diagram illustrating a method 300 for training an NN to perform macro placement in a continuous action space according to one embodiment. The input to method 300 includes a training set of chips, a validation set of chips, and an untrained NN. Method 300 includes three operations: a sample collection operation (S310), a training operation (S320), and an evaluation operation (S330). S310, S320, and S330 are repeated until a reward r output from S330 reaches a predetermined threshold (S340). An example of a reward is an objective, such as the wirelength or another design metric. At this point, the training is completed and the output is a trained NN for macro placement.

Figure 4:
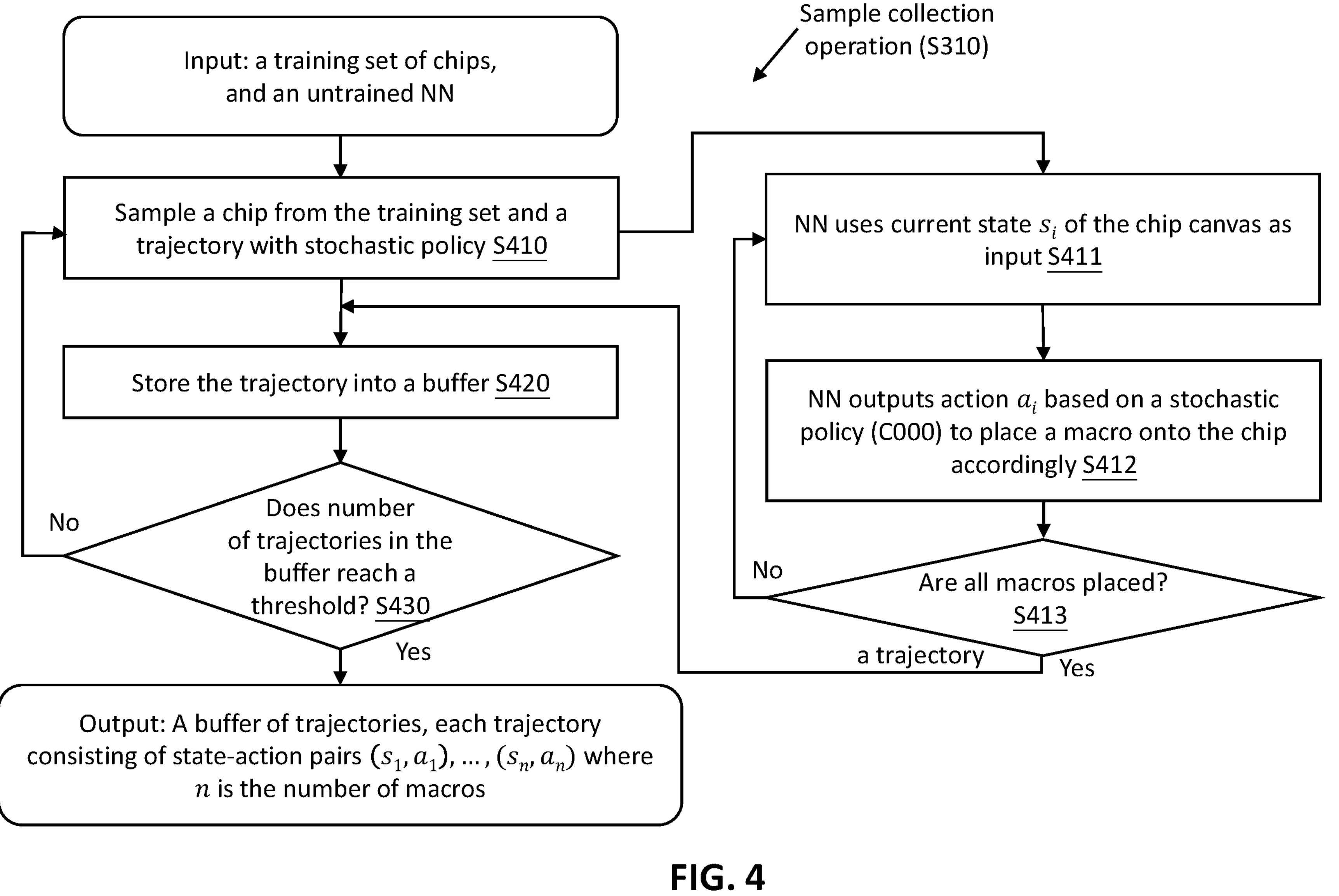
FIG. 4 is a flow diagram of a sample collection operation according to one embodiment.

FIG. 4 is a flow diagram of the sample collection operation (S310) according to one embodiment. In the sample collection operation, the NN samples a chip from the training set and samples (i.e., generates) a trajectory on the chip with the stochastic policy (S410). The stochastic policy is described with reference to network C000 in FIG. 1A. To generate a trajectory, the NN uses the current state $s_i$ of the chip canvas as input (S411). The NN samples action $a_i$ according to a continuous probability distribution (generated by the NN) based on the stochastic policy (S412). The sampled action specifies a position on the sampled chip to place a macro. S411 and S412 are repeated until all of the macros are placed (S413), and a trajectory is formed by the sequence of (state, action) pairs. The trajectory is then stored in a buffer (S420). When the number of trajectories in the buffer reaches a threshold (S430), the buffer is provided as input to the training operation (S320).

Figure 5:
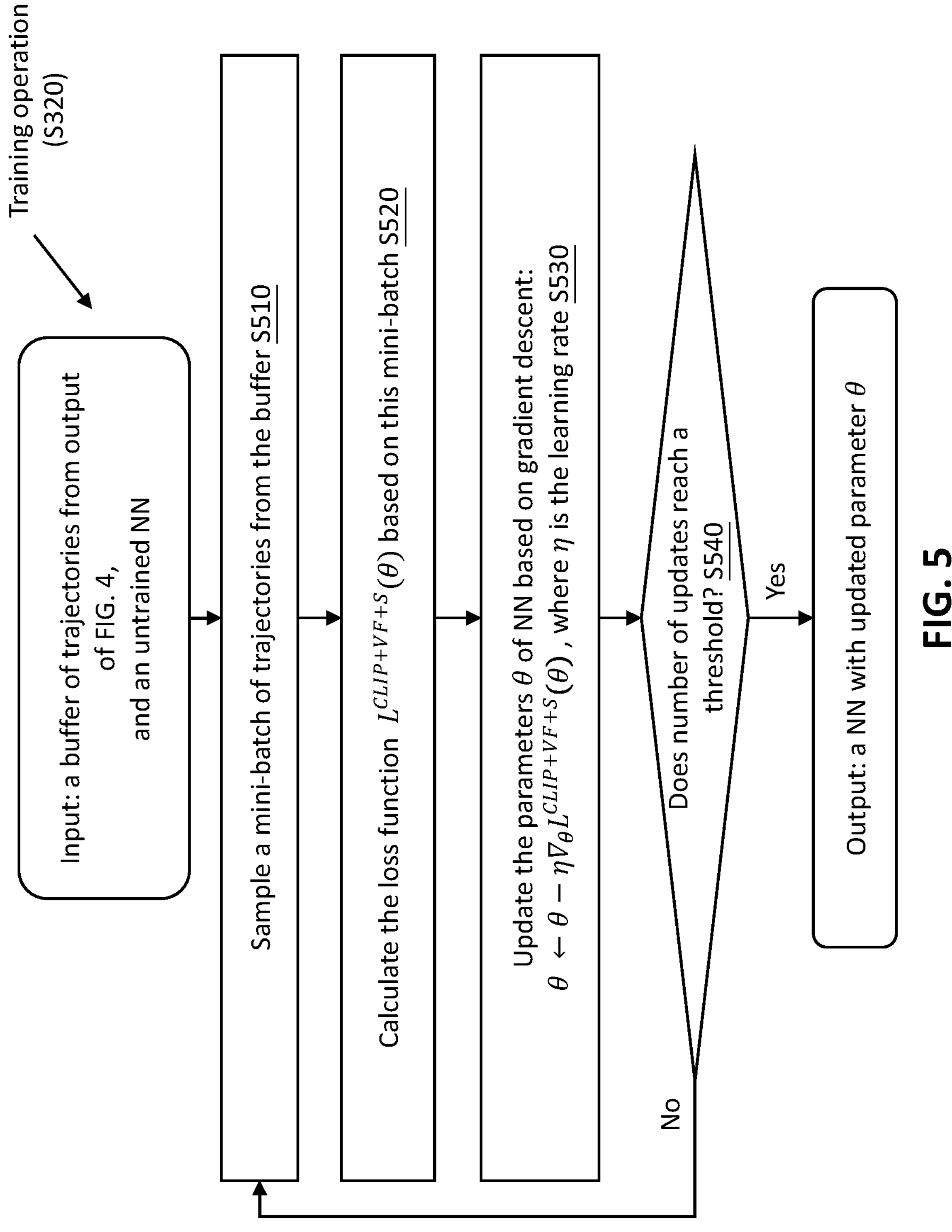
FIG. 5 is a flow diagram of a training operation according to one embodiment.

FIG. 5 is a flow diagram of the training operation (S320) according to one embodiment. The input to the training operation (S320) includes a buffer of trajectories from the output of FIG. 4, and an untrained NN. The training operation begins with the system sampling a mini-batch of trajectories from the buffer (S510). The system calculates the loss function $L^{CLIP+VF+S}(\theta)$ using this mini-batch (S520), and updates the parameters θ of NN based on gradient descent (S530): $\theta \leftarrow \theta - \eta \nabla_\theta L^{CLIP+VF+S}(\theta)$, where η is the learning rate. S510, S520, and S530 are repeated until the number of updates reaches a predetermined threshold (S540). When the predetermined threshold is reached, the NN has the updated parameter θ.

The update to the NN parameter θ in S530 is calculated using a Proximal Policy Optimization (PPO) gradient estimator with generalized advantage estimation. The loss function ($L^{CLIP+VF+S}$) is described in equation (9) of "*Proximal policy optimization algorithms*, Schulman et al., arXiv preprint arXiv: 1707.06347 (2017).

Figure 6:
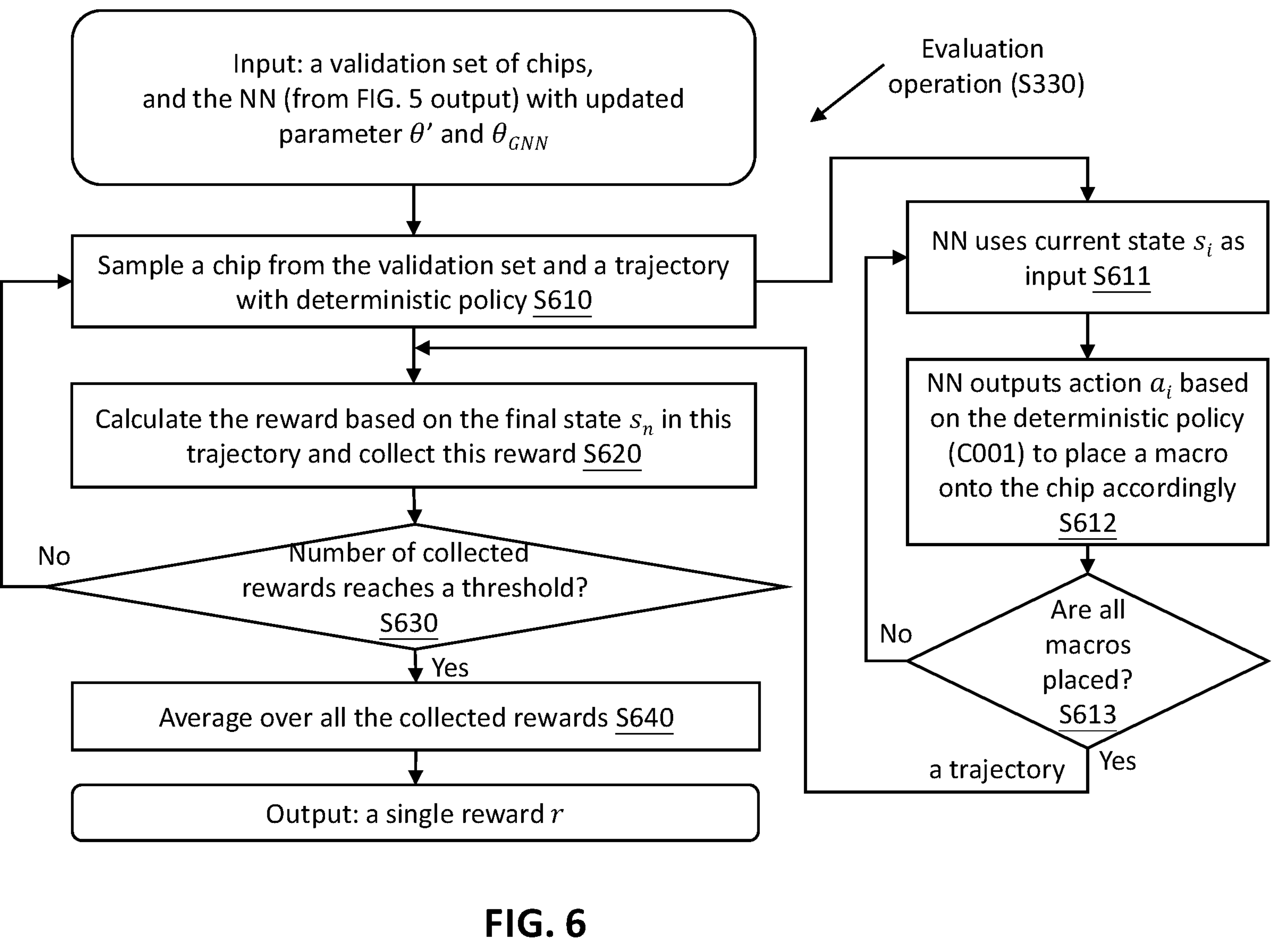
FIG. 6 is a flow diagram of an evaluation operation according to one embodiment.

FIG. 6 is a flow diagram of the evaluation operation (S330) according to one embodiment. The evaluation operation (S330) evaluates the training progress of the NN based on a reward value. The input to the evaluation operation (S330) includes the validation set of chips (in the input of FIG. 3), and the NN with updated parameter θ (in the output of FIG. 5). The evaluation operation (S330) begins with the NN samples a chip in the validation set and samples (i.e., generates) a trajectory on the chip with the deterministic policy (S610). The deterministic policy is described with reference to network C001 in FIG. 1A. To generate a trajectory, the NN uses the current state $s_i$ as input (S611). The NN chooses an action $a_i$ that has the highest probability according to a continuous probability distribution (generated by the NN) based on the deterministic policy (S612). The chosen action specifies a position on the sampled chip to place a macro. S611 and S612 are repeated until all of the macros are placed (S613), and a trajectory is formed by the sequence of (state, action) pairs. The system calculates a reward r based on the final state $S_n$ in this trajectory and collects this reward (S630). S610, S620 (including S611-S612), and S630 are repeated until the number of collected rewards has reached a predetermined threshold. Then the system averages all the collected rewards (S640) and outputs a single reward value.

Referring back to FIG. 3, after the evaluation operation (S330), the single reward value is compared with a threshold (S340). The operations S310, S320, and S330 are repeated until the single reward value output from the evaluation operation (S330) reaches the threshold. At this point, the NN is trained to output actions in a continuous action space. The trained NN may be given a new chip and macros to be placed on this new chip.

Figure 7:
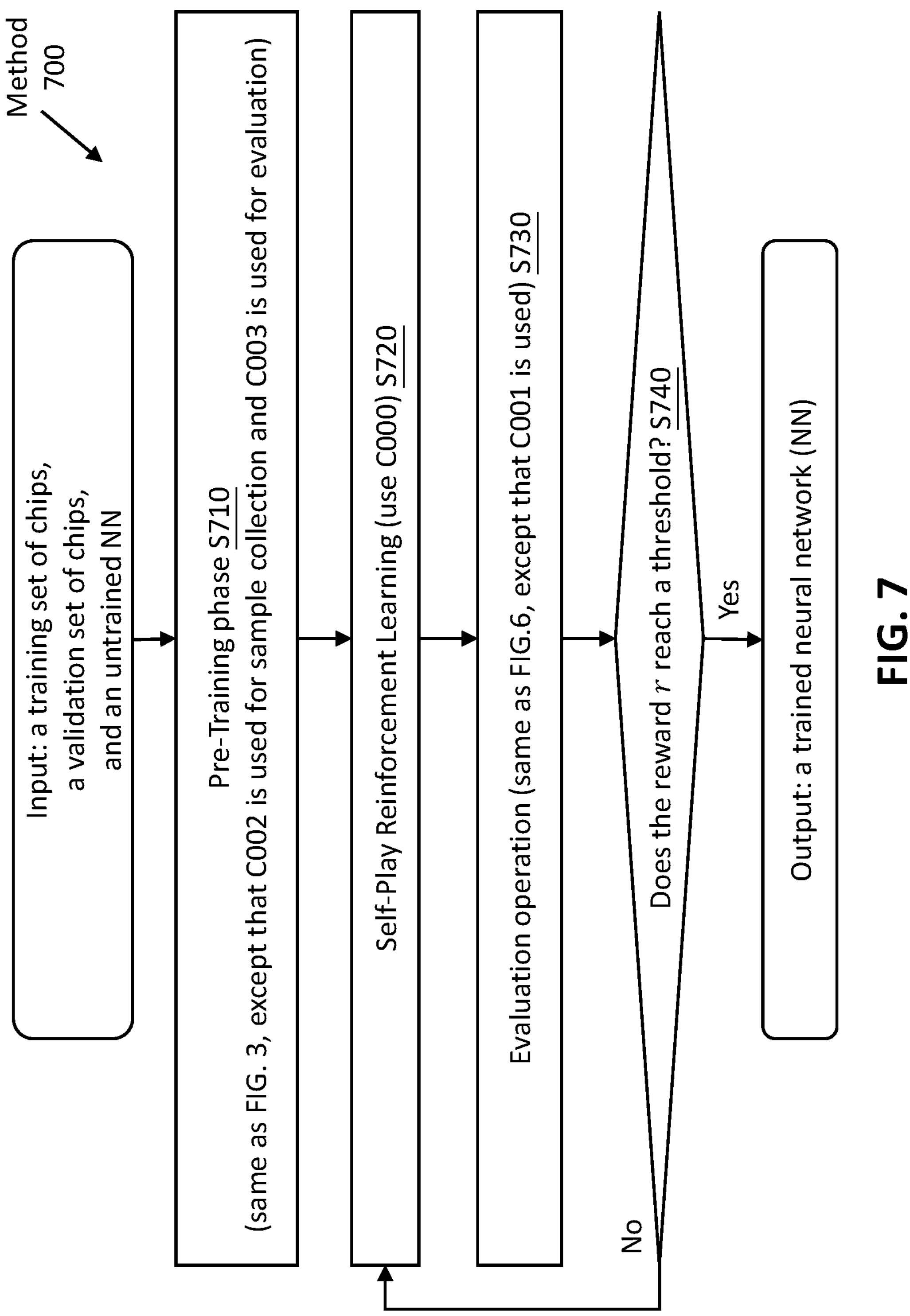
FIG. 7 is a flow diagram illustrating a method for training an NN to perform macro placement in a continuous action space according to another embodiment.

FIG. 7 is a flow diagram illustrating a method 700 for training an NN to perform macro placement in a continuous action space according to another embodiment. Method 700 starts with a pre-training phase (S710), which performs the same operation as method 300, except that the actions produced by method 700 are discretized as in C002 and C003. That is, the sample collection operation (S310) in FIG. 4 uses C002 for the stochastic policy, and the evaluation operation (S330) in FIG. 6 uses C003 for the deterministic policy. After the NN is pre-trained in the discretized action space, the NN is further trained (i.e., fine-tuned) with self-play reinforcement learning (S720) in the continuous action space using C000. The output of the self-play reinforcement learning (S720) is the NN with updated weights. An evaluation operation (S730), which is the same as the evaluation operation (S330) in FIG. 6, is performed on the NN with updated weights using C001 for the deterministic policy in the continuous action space. The output of the evaluation operation (S730) is a single reward value. The single reward value is compared with a threshold (S740). The operations S720 and S730 are repeated until the single reward value from the evaluation operation (S730) reaches the threshold (S740). At this point, the NN is trained to output actions in a continuous action space. The trained NN may be given a new chip and macros to be placed on this new chip.

Figure 8:
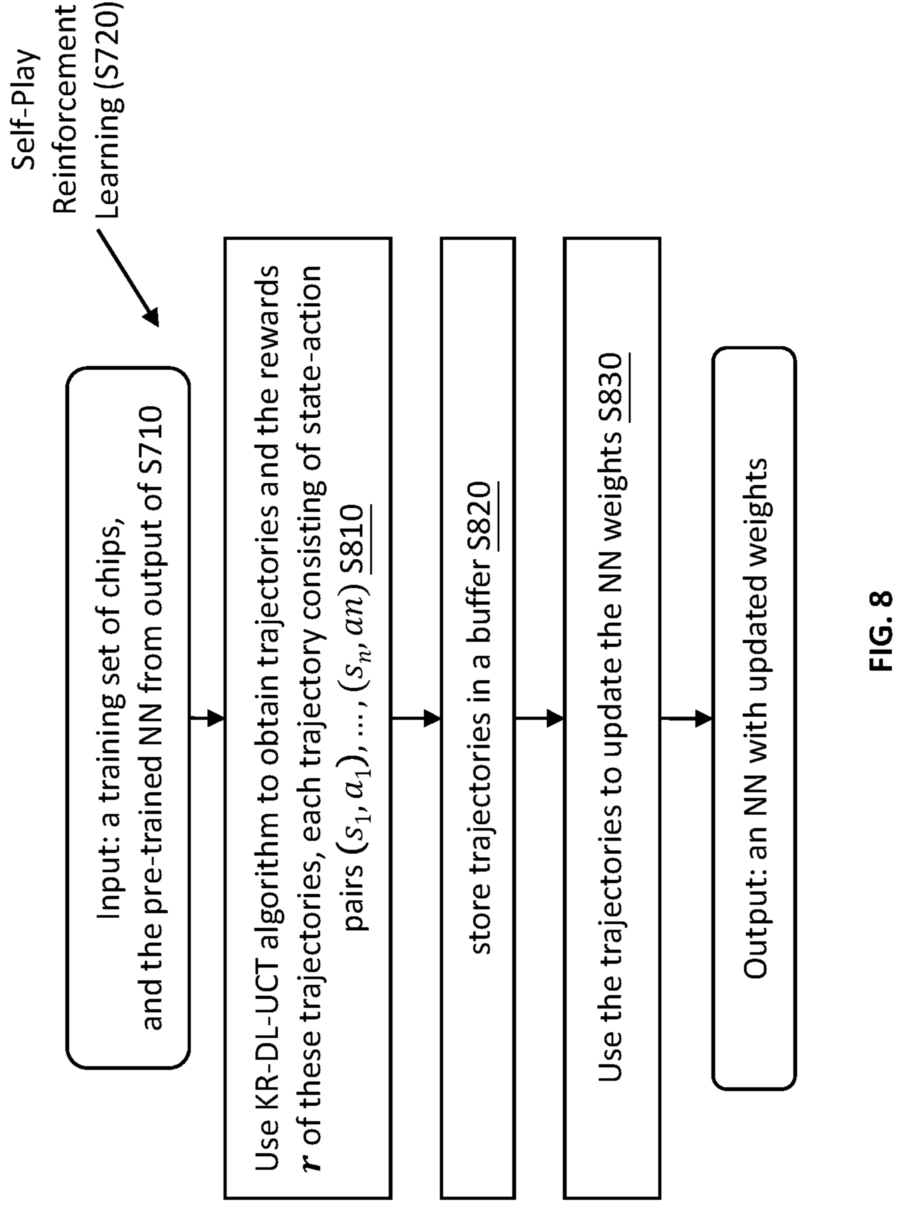
FIG. 8 is a flow diagram illustrating self-play reinforcement learning according to one embodiment.

FIG. 8 is a flow diagram illustrating the self-play reinforcement learning (S720) according to one embodiment.

The system applies a KR-DL-UCT algorithm 900 (FIG. 9) to the NN to obtain trajectories as well as the rewards r of these trajectories (S810). Each trajectory consists of state-action pairs $(s_1, a_1), \ldots, (s_n, a_n)$. The system stores trajectories in a buffer (S820), and uses the trajectories to update the NN weights (S830). The output is an NN with updated weights.

FIG. 9 illustrates a KR-DL-UCT algorithm 900 for macro placement according to one embodiment. KR-DL-UCT algorithm 900 is based on the algorithm with the same name described in "*Deep Reinforcement Learning in Continuous Action Spaces: a Case Study in the Game of Simulated Curling*, Lee et al., ICML 2018." KR-DL-UCT algorithm 900 searches for an action and its expected reward using a Monte Carlo tree search (MCTS) method, which includes four stages: Selection, Expansion, Simulation, and Back-propagation. For macro placement applications, there exist some invalid actions in the action space. For example, a macro can not be placed on a location which results in an overlap that exceeds a tolerance with other macros. To disable these invalid actions, a mask (e.g., mask 18 in FIG. 1A) is applied to the output of the policy network to ensure that the actions are valid. Thus, in line 13 of algorithm 900, $a_t'$ is selected under some constraints to ensure that $a_t'$ is valid. For example: $a_t' = \operatorname{argmin}_{K(a_t,a)>\gamma \text{ and } a \text{ is valid}} W(a)$.

In the pre-training phase (S710), the NN parameter θ update is calculated using the PPO method. The self-play reinforcement learning (S720) uses the MCTS method to further fine-tune the NN. The policy obtained from MCTS is then projected back into the function space of the policy network of the NN. For each time-step t in the self-play, with the root state St, the MCTS returns r and p, where r represents the estimated probability distribution of the reward, and p represents the probability distribution of actions and is proportional to the estimated visit counts based on kernel density estimation, $p_a \propto W(a)^{1/\tau}$, where τ is a temperature parameter. The parameters of the policy-value network continually are updated by data (s, p, r), using the following loss function: $L(\theta) = -r \log V_\theta(s) - p \log \pi_\theta(a; s) + c\|\theta\|^2$, where $\pi_\theta(a; s)$ is the output of the policy network, $V_\theta(s)$ is the output of the value network, θ is the NN weights, and c is a constant for regularization. The steps for updating the NN weights are described in further detail with reference to FIG. 10 below.

Figure 10:
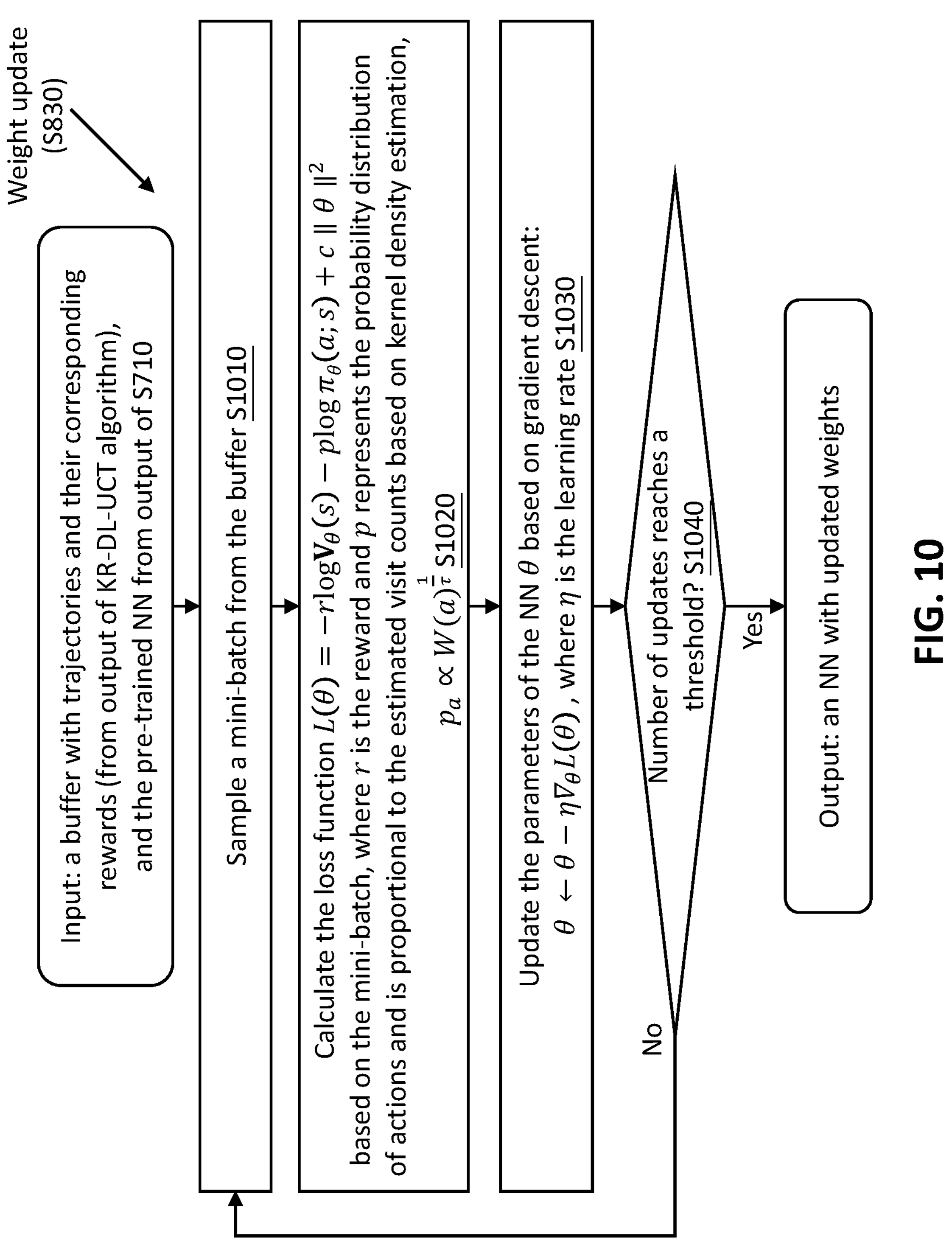
FIG. 10 is a flow diagram illustrating a weight update operation according to one embodiment.

FIG. 10 is a flow diagram illustrating the weight update operation (S830) according to one embodiment. The weight update operation (S830) is the final step of the self-play reinforcement learning (S720) in FIG. 8. The input to S830 includes a buffer with trajectories and their corresponding rewards from the output of KR-DL-UCT algorithm 900, and the pre-trained NN from the output of S710 in FIG. 7. The weight update operation (S830) begins with the system sampling a mini-batch from the buffer of trajectories (S1010). The system calculates a loss function $L(\theta) = -r \log V_\theta(s) - p \log \pi_\theta(a;s) + c\|\theta\|^2$ based on the mini-batch (S1020), where r is the reward and p represents the probability distribution of actions and is proportional to the estimated visit counts based on kernel density estimation, $p_a \propto W(a)^{1/\tau}$. The system then updates the parameters of the NN θ based on gradient descent: $\leftarrow \theta - \eta \nabla_\theta L(\theta)$, where η is the learning rate (S1030). S1010, S1020, and S1030 are repeated until the number of updates reaches a threshold (S1040). The output is the NN with updated weights.

Figure 11:
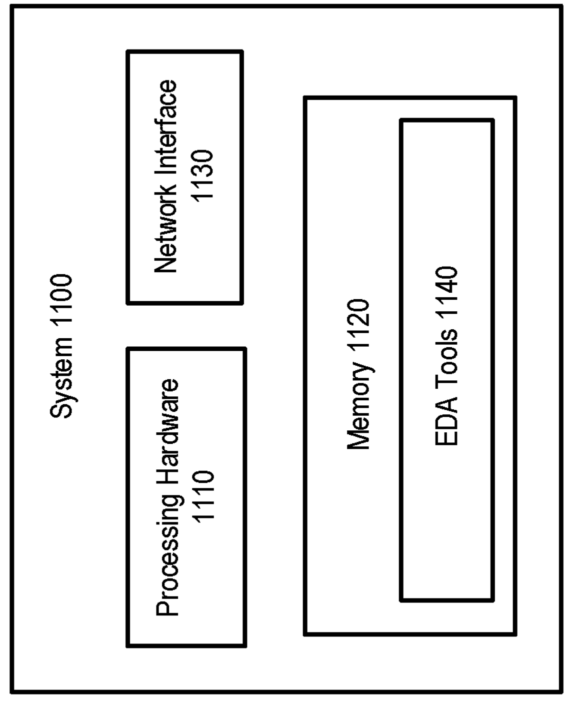
FIG. 11 illustrates an example of a system according to one embodiment.

FIG. 11 illustrates an example of a system 1100 according to one embodiment. System 1100 includes processing hardware 1110, a memory 1120, and a network interface 1130. In one embodiment, processing hardware 1110 may include one or more processors and accelerators, such as one or more of: a central processing unit (CPU), a GPU, a digital processing unit (DSP), an AI processor, a tensor processor, a neural processor, a multimedia processor, other general-purpose and/or special-purpose processing circuitry.

System 1100 further includes the memory 1120 coupled to processing hardware 1110. Memory 1120 may include memory devices such as dynamic random access memory (DRAM), SRAM, flash memory, and other non-transitory machine-readable storage media; e.g., volatile or non-volatile memory devices. Memory 1120 may further include storage devices, for example, any type of solid-state or magnetic storage device. In one embodiment, memory 1120 may store one or more EDA tools 1140 including but not limited to neural networks, AI agents, and other tools for macro placement. Examples of EDA tools 1140 include C000 and C001 (FIG. 1A), and C002 and C003 (FIG. 1B). In some embodiments, memory 1120 may store instructions which, when executed by processing hardware 1110, cause the processing hardware to perform the aforementioned methods and operations for macro placement and/or for training an NN to perform macro placement. However, it should be understood that the aforementioned methods and operations can be performed by embodiments other than the embodiments of C000 and C001 (FIG. 1A), and C002 and C003 (FIG. 1B).

In some embodiments, system 1100 may also include a network interface 1130 to connect to a wired and/or wireless network. It is understood the embodiment of FIG. 11 is simplified for illustration purposes. Additional hardware components may be included.

Figure 12:
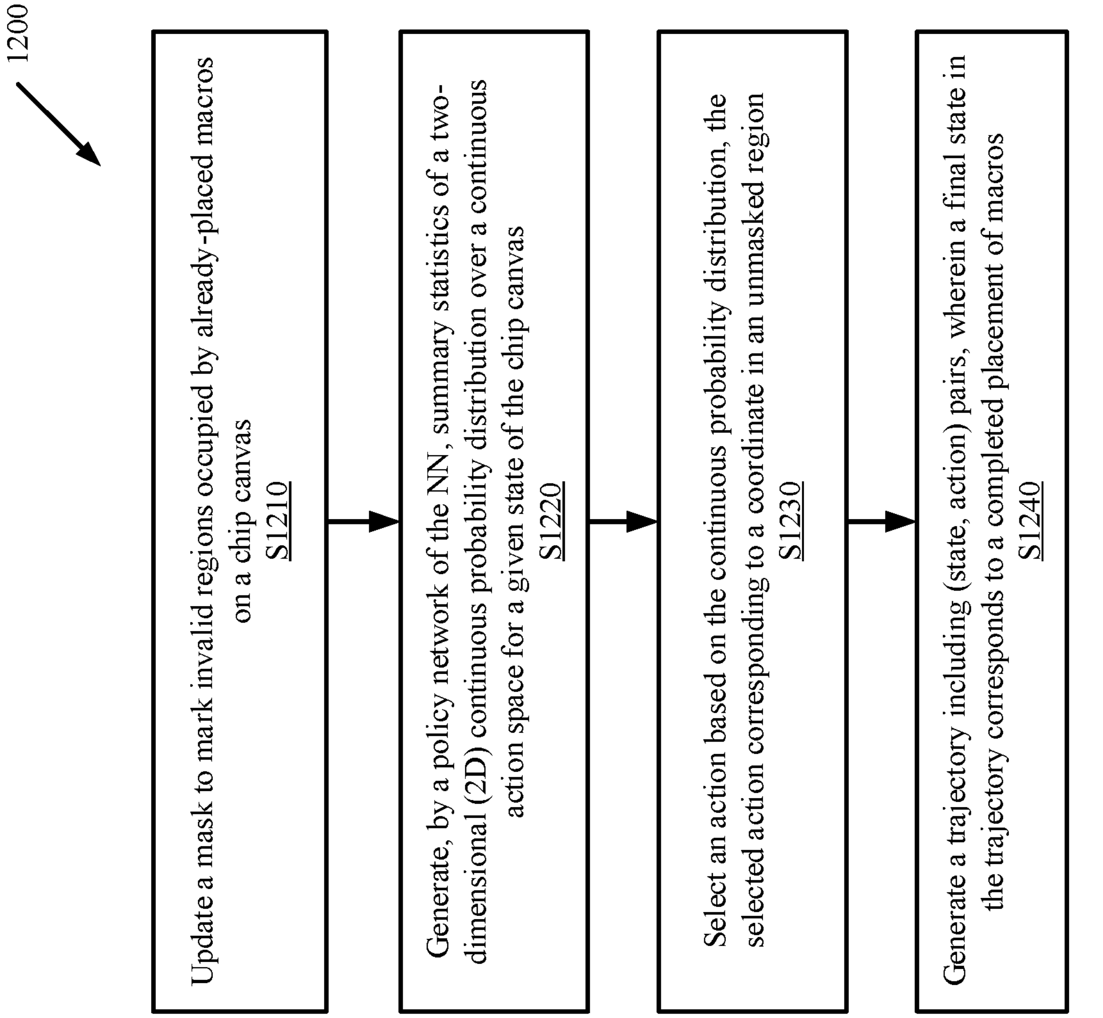
FIG. 12 is a flow diagram illustrating a method for an NN to perform macro placement according to one embodiment.

FIG. 12 is a flow diagram illustrating a method 1200 for an NN to perform macro placement according to one embodiment. Method 1200 may be performed by a computing system, such as system 1100 in FIG. 11. Method 1200 begins with updating a mask to mark invalid regions occupied by already-placed macros on a chip canvas (S1210). A policy network of the NN generates summary statistics of a two-dimensional (2D) continuous probability distribution over a continuous action space for a given state of the chip canvas (S1220). The NN selects an action based on the continuous probability distribution, the selected action corresponding to a coordinate in an unmasked region (S1230). The NN further generates a trajectory including (state, action) pairs, wherein a final state in the trajectory corresponds to a completed placement of macros (S1240).

In one embodiment, the summary statistics include at least a mean and a standard deviation in each dimension of the continuous probability distribution. The policy network may output four real numbers as the summary statistics to characterize the continuous probability distribution. In one embodiment, the mask is updated after each of the macros is placed.

In one embodiment, the NN is trained in the continuous action space. The NN may be pre-trained in a discretized action space, in which a coordinate corresponding to a given action is rounded to a fixed-length number, and further trained in the continuous action space. In one embodiment, the NN is pre-trained in a discretized action space within the unmasked region that is repeatedly updated. The pre-trained NN is fine-tuned by self-play reinforcement learning in the continuous action space within the unmasked region that is repeatedly updated. In one embodiment, the self-play reinforcement learning uses a KR-DL-UCT algorithm subject to a constraint of the mask.

In one embodiment, the NN samples one or more actions stochastically from the continuous action space based on the continuous probability distribution until one action is in the unmasked region, and generates a collection of trajectories based on repeatedly sampling actions. Then the parameters of the NN are updated based on a loss function calculated from the trajectories. In one embodiment, the NN chooses an action from the continuous action space within the unmasked region, the chosen action having a highest probability within the unmasked region based on the continuous probability distribution. The NN generates a collection of trajectories based on repeatedly choosing actions. Then a training progress of the NN is evaluated based on a reward value calculated from the trajectories.

Various functional components or blocks have been described herein. As will be appreciated by persons skilled in the art, the functional blocks will preferably be implemented through circuits (either dedicated circuits, or general-purpose circuits, which operate under the control of one or more processors and coded instructions), which will typically comprise transistors that are configured in such a way as to control the operation of the circuitry in accordance with the functions and operations described herein.

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A method for a neural network (NN) to perform macro placement on a chip, comprising:

- updating a mask to mark invalid regions occupied by already-placed macros on a chip canvas;
- generating, by a policy network of the NN, summary statistics of a two-dimensional (2D) continuous probability distribution over a continuous action space for a given state of the chip canvas;
- selecting an action based on the continuous probability distribution, the selected action corresponding to a coordinate in an unmasked region; and
- generating a trajectory including (state, action) pairs, wherein a final state in the trajectory corresponds to a completed placement of macros.

2. The method of claim 1, wherein the summary statistics include at least a mean and a standard deviation in each dimension of the continuous probability distribution.

3. The method of claim 1, wherein the policy network outputs four real numbers as the summary statistics to characterize the continuous probability distribution.

4. The method of claim 1, wherein the NN is trained in the continuous action space.

5. The method of claim 1, wherein the NN is pre-trained in a discretized action space, in which a coordinate corresponding to a given action is rounded to a fixed-length number, and is further trained in the continuous action space.

6. The method of claim 1, further comprising:

- pre-training the NN in a discretized action space within the unmasked region that is repeatedly updated, wherein in the discretized action space coordinate corresponding to a given action is rounded to a fixed-length number; and
- fine-tuning the pre-trained NN by self-play reinforcement learning in the continuous action space within the unmasked region that is repeatedly updated.

7. The method of claim 6, wherein the self-play reinforcement learning uses a KR-DL-UCT algorithm subject to a constraint of the mask, and wherein KR-DL-UCT stands for Kernel Regression-Deep Learning-Upper Confidence bounds applied to Trees.

8. The method of claim 1, wherein selecting the action further comprises:

- sampling one or more actions stochastically from the continuous action space based on the continuous probability distribution until one action is in the unmasked region;
- generating a collection of trajectories based on repeatedly sampling actions; and
- updating parameters of the NN based on a loss function calculated from the trajectories.

9. The method of claim 1, wherein selecting the action further comprises:

- choosing the action from the continuous action space within the unmasked region, the chosen action having a highest probability within the unmasked region based on the continuous probability distribution;
- generating a collection of trajectories based on repeatedly choosing actions; and
- evaluating a training progress of the NN based on a reward value calculated from the trajectories.

10. The method of claim 1, wherein updating the mask further comprises:

updating the mask after placing each of the macros.

11. A system operative to train a neural network (NN) for macro placement comprising:

- processing hardware; and
- memory coupled to the processing hardware to store information on the NN and macros to be placed on a chip, wherein the processing hardware is operative to:
  - update a mask to mark invalid regions occupied by already-placed macros on a chip canvas;
  - generate, by a policy network of the NN, summary statistics of a two-dimensional (2D) continuous probability distribution over a continuous action space for a given state of the chip canvas;
  - select an action based on the continuous probability distribution, the selected action corresponding to a coordinate in an unmasked region; and generate a trajectory including (state, action) pairs, wherein a final state in the trajectory corresponds to a completed placement of macros.

12. The system of claim 11, wherein the summary statistics include at least a mean and a standard deviation in each dimension of the continuous probability distribution.

13. The system of claim 11, wherein the policy network outputs four real numbers as the summary statistics to characterize the continuous probability distribution.

14. The system of claim 11, wherein the NN is trained in the continuous action space.

15. The system of claim 11, wherein the NN is pre-trained in a discretized action space, in which a coordinate corresponding to a given action is rounded to a fixed-length number, and is further trained in the continuous action space.

16. The system of claim 11, the processing hardware is further operative to:

- pre-train the NN in a discretized action space within the unmasked region that is repeatedly updated, in which a coordinate corresponding to a given action is rounded to a fixed-length number; and
- fine-tune the pre-trained NN by self-play reinforcement learning in the continuous action space within the unmasked region that is repeatedly updated.

17. The system of claim 16, wherein the self-play reinforcement learning uses a KR-DL-UCT algorithm subject to a constraint of the mask, and wherein KR-DL-UCT stands for Kernel Regression-Deep Learning-Upper Confidence bounds applied to Trees.

18. The system of claim 11, wherein when selecting the action, the processing hardware is further operative to:

sample one or more actions stochastically from the continuous action space based on the continuous probability distribution until one action is in the unmasked region;

generate a collection of trajectories based on repeatedly sampling actions; and update parameters of the NN based on a loss function calculated from the trajectories.

19. The system of claim 11, wherein when selecting the action, the processing hardware is further operative to:

choose the action from the continuous action space within the unmasked region, the chosen action having a highest probability within the unmasked region based on the continuous probability distribution;

generate a collection of trajectories based on repeatedly choosing actions; and evaluate a training progress of the NN based on a reward value calculated from the trajectories.

20. The system of claim 11, wherein the processing hardware is further operative to update the mask after placing each of the macros.

* * * * *